United States Patent
Saitou et al.

(10) Patent No.: US 7,449,393 B2
(45) Date of Patent: Nov. 11, 2008

(54) METHOD OF MANUFACTURING A SEMICONDUCTOR DEVICE WITH A SHALLOW TRENCH ISOLATION STRUCTURE

(75) Inventors: Kenji Saitou, Kanagawa (JP); Kenichi Hidaka, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 149 days.

(21) Appl. No.: 11/090,839

(22) Filed: Mar. 25, 2005

(65) Prior Publication Data

US 2005/0221580 A1    Oct. 6, 2005

(30) Foreign Application Priority Data

Mar. 31, 2004    (JP)    ............... 2004/101663

(51) Int. Cl.
   *H01L 21/76*    (2006.01)
(52) U.S. Cl. .............. 438/435; 438/690; 438/692; 257/E21.546
(58) Field of Classification Search ............. 438/435, 438/690, 692; 257/E21.546
   See application file for complete search history.

(56) References Cited

U.S. PATENT DOCUMENTS

| 5,702,977 | A | * | 12/1997 | Jang et al. | .............. 216/38 |
| 6,245,641 | B1 | | 6/2001 | Shiozawa et al. | |
| 6,355,517 | B1 | * | 3/2002 | Sunami et al. | .............. 438/246 |
| 6,905,967 | B1 | * | 6/2005 | Tian et al. | .............. 438/697 |
| 2005/0006697 | A1 | | 1/2005 | Hsieh | |
| 2005/0142725 | A1 | | 6/2005 | Jung et al. | |
| 2005/0153519 | A1 | * | 7/2005 | Lu et al. | .............. 438/424 |
| 2005/0170608 | A1 | | 8/2005 | Kiyotoshi et al. | |
| 2005/0221559 | A1 | | 10/2005 | Sumino et al. | |

FOREIGN PATENT DOCUMENTS

JP    2002-110780    4/2002

* cited by examiner

*Primary Examiner*—Bradley K Smith
(74) *Attorney, Agent, or Firm*—McGinn IP Law Group, PLLC (57) ABSTRACT

In a method of manufacturing a semiconductor device with a shallow trench isolation structure, trenches are formed to extend into a semiconductor substrate. Subsequently, a first insulating film is formed to fill the trenches and to cover a whole surface of the semiconductor substrate, and then a first chemical mechanical polishing (CMP) method is carried out to remove the first insulating film such that the first insulating film is left only in the trenches. Subsequently, a second insulating film is formed to fill the trenches and to cover a whole surface of the semiconductor substrate, and a second CMP method is carried out to remove the second insulating film such that the second insulating film is left only in the trenches.

21 Claims, 10 Drawing Sheets

METHOD OF MANUFACTURING A SEMICONDUCTOR DEVICE WITH A SHALLOW TRENCH ISOLATION STRUCTURE

BACKGROUND OF THE INVENTION

1. Field of the Invention

The present invention relates to a method of manufacturing a semiconductor device with a trench-type device isolation insulating film.

2. Description of the Related Art

In a semiconductor device including a nonvolatile memory such as a flash memory, in which a large number of element (memory cells) are arranged on a semiconductor substrate, trench-type device isolation insulating films for isolating the elements are formed thereon. These trench-type device isolation insulating films are formed as STI films, and trenches are formed to extend into the semiconductor substrate to a predetermined depth, and the trenches are filled with the insulating films.

Figure 1:
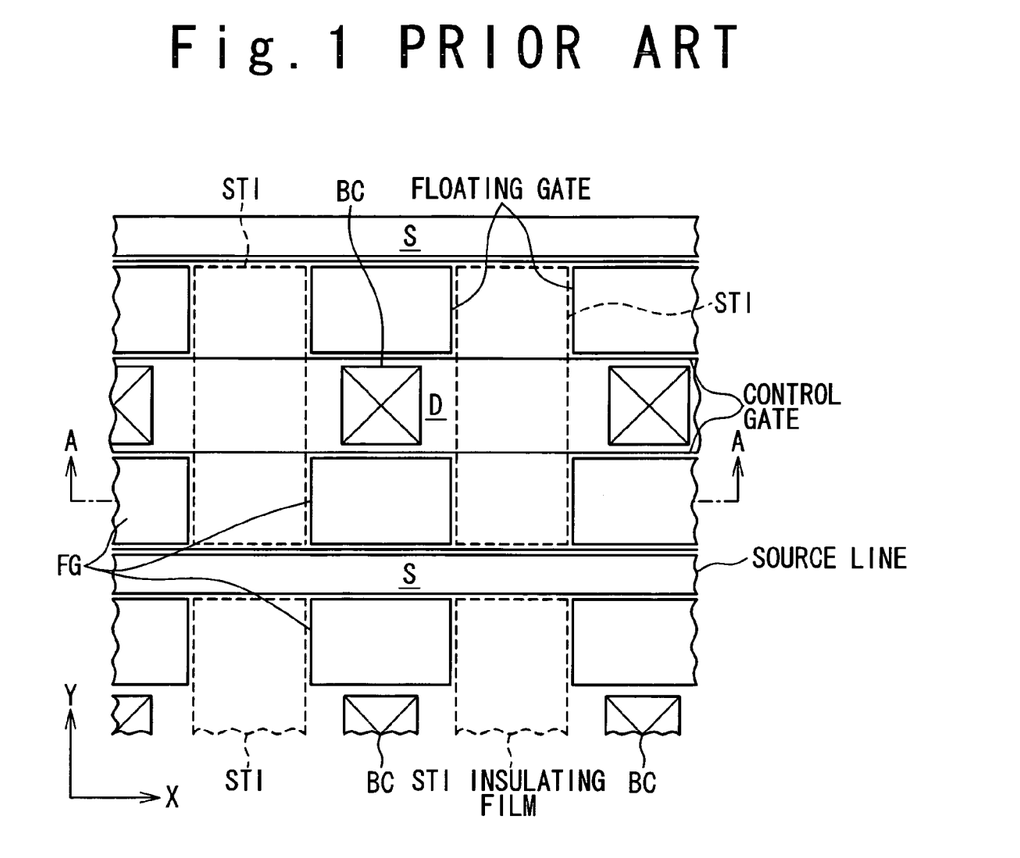
FIG. 1 is a plan view showing a layout of a conventional flash memory.
Figure 2:
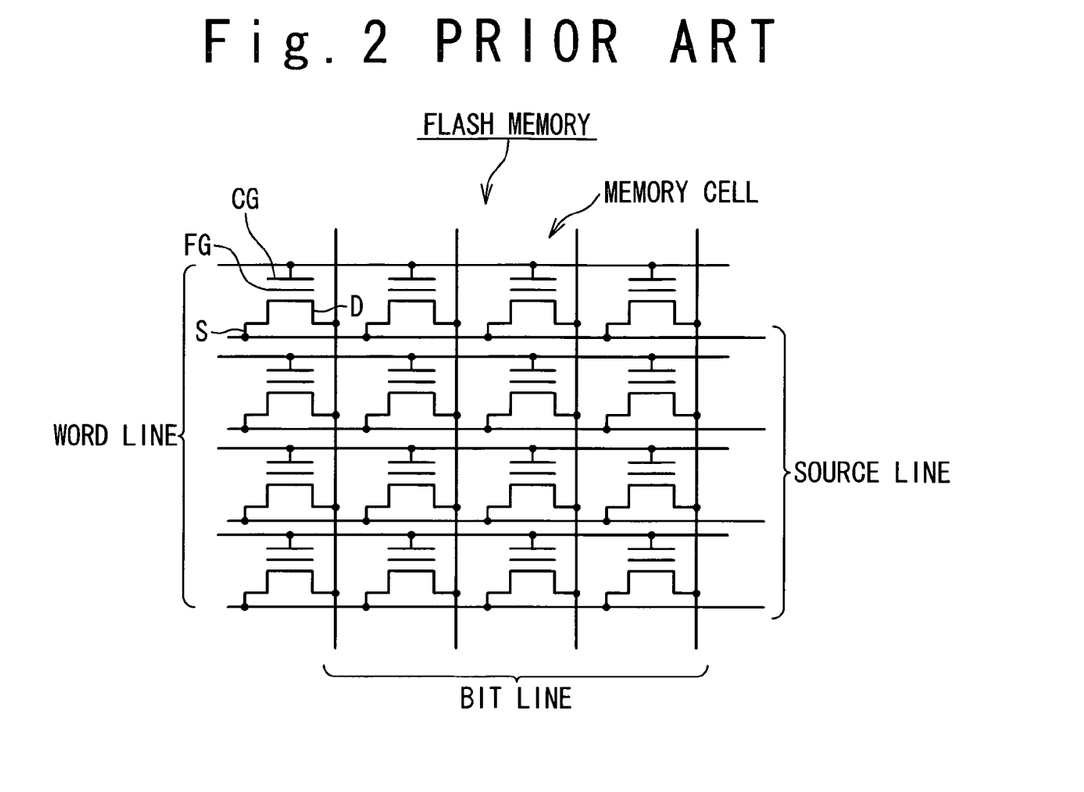
FIG. 2 is a circuit diagram of the conventional flash memory.

FIG. 1 is a plan view showing a conventional flash memory, and FIG. 2 is a circuit diagram thereof. The trench-type device isolation insulating films STI are formed on the semiconductor substrate in an island manner in a predetermined interval in the X-direction to extend in the Y-direction, as shown in FIG. 1. Memory cells M are formed on the semiconductor substrate between the trench-type device isolation insulating films STI in the X direction, and a plurality of island-shaped floating gates FG of the memory cells M are arranged in the Y-direction, and a source region S and a drain region D of each memory cell M is formed to put the floating gate FG between them. The source regions S are formed as source lines SL to extend in the X-direction, and bit line contacts BC are formed on the drain regions D to connect them to bit lines BL, as shown in FIG. 2. Also, capacitive insulating films are formed on the floating gates FG, and control gates CG as word lines WL are formed on the capacitive insulating films to extend in the X-direction, although they are not shown in the Figure.

Figure 3A:
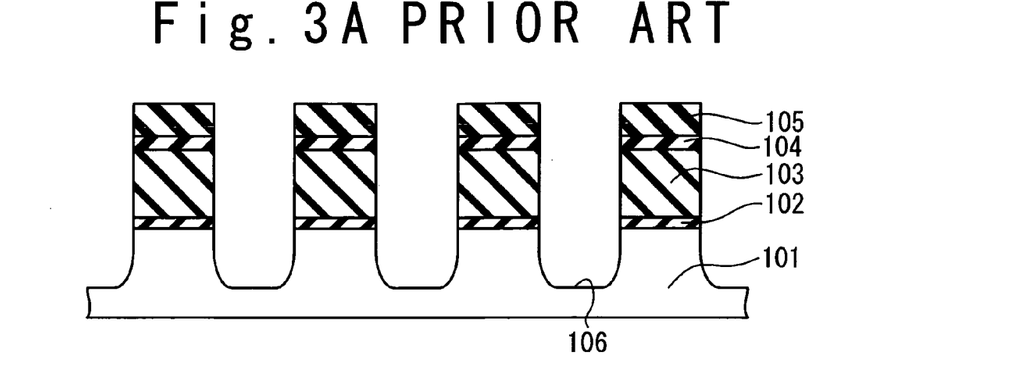
FIGS. 3A to 3C are cross sectional views showing the conventional flash memory in a manufacturing process.
Figure 3B:
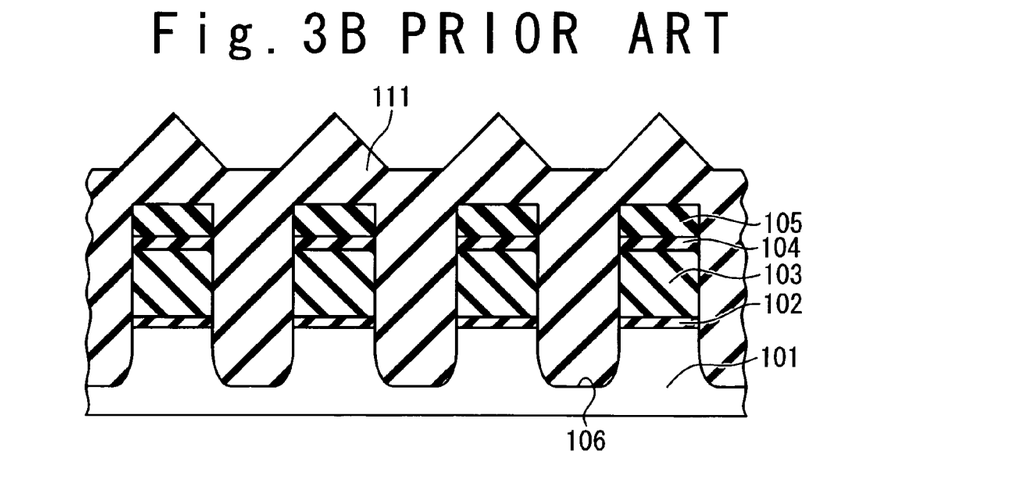
Figure 3C:
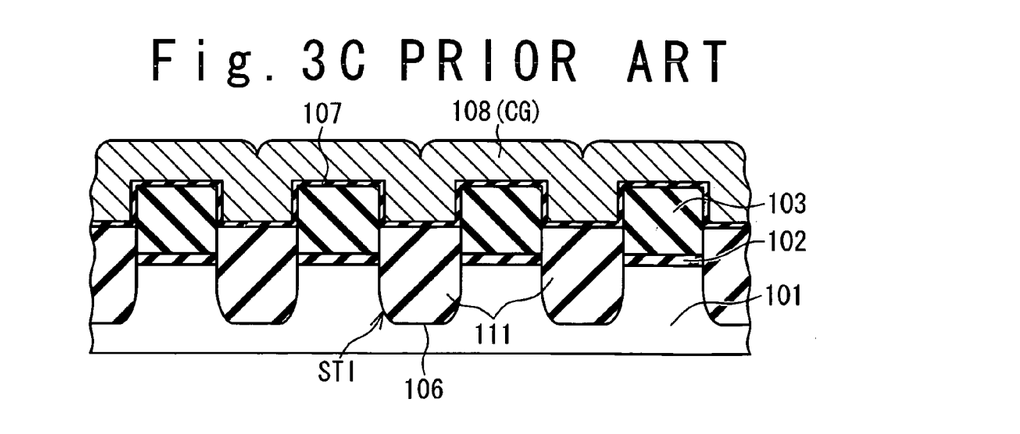

FIGS. 3A to 3C are cross sectional views showing the conventional flash memory. Referring to FIGS. 3A to 3C, a method of manufacturing the conventional flash memory with the trench-type device isolation insulating film STI. As shown in FIG. 3A, a tunnel oxide film 102, a floating gate film 103, a buffering oxide film 104 and a nitride film 105 as a stopper film are successively laminated on the surface of a semiconductor substrate 101. Subsequently, these films are selectively etched to form trenches 106 having a predetermined depth and extending into the semiconductor substrate 101. Next, as shown in FIG. 3B, an insulating film 111 is formed to fill the trenches 106 and to cover the nitride film 105. Then, as shown in FIG. 3C, the insulating film 111 is polished by a CMP (Chemical Machine Polishing) method by utilizing the nitride film 105 as a stopper film, so as to flatten the surface of the insulating film 111. Then, the nitride film 105 and the oxide film 104 are etched, and the insulating film 111 is etched so that the insulating film 111 is remained only in the trenches 106 to form a trench-type device isolation insulating film STI. Thereafter, a capacitive insulating film 107 and a control gate film 108 are formed and these films are patterned to a predetermined pattern. Subsequently, impurity is implanted in the semiconductor substrate 101. Thus, the memory cells of the conventional flash memory are formed.

Japanese Laid Open Patent Application (JP-P2002-110780A) discloses a conventional manufacturing method of a trench-type device isolation insulating film. In this conventional example, a first isolation film is formed in trenches which are formed in a semiconductor substrate, and the trenches are partially filled through an annealing process. Subsequently, the trenches are completely filled with a second isolation film. Then, a CMP method is carried out for flattening the surface to form the trench-type device isolation insulating film. In this conventional example, the first isolation film is partially buried to relax a stress due to difference in thermal expansion coefficient between the semiconductor substrate and the insulating film, to prevent defects in the trench-type device isolation insulating film, and to improve the device reliability.

Figure 4A:
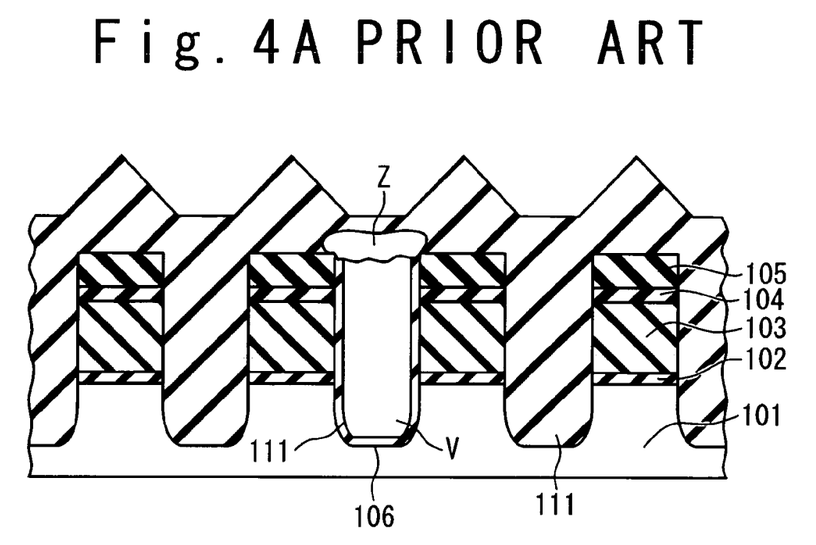
FIGS. 4A and 4B are cross sectional views showing the conventional flash memory in a manufacturing process.

In the above method of manufacturing a trench-type device isolation insulating film, when an insufficient buried portion with the insulating film is produced, a defective semiconductor device is manufactured. For example, in the trench-type device isolation insulating film STI formed by the manufacturing method shown in FIGS. 3A to 3C, there would be a case that a part of the trenches 106 is clogged by a minute foreign substance Z generated upon the forming of the insulating film 111, so that the trench 106 located right under the foreign substance Z is not filled with the insulating film 111, as shown in FIG. 4A. The foreign substance Z is produced through separation of a part of an insulating film from the inner wall of a film forming apparatus (not shown), floats inside the film forming apparatus, and adheres on the surface of the semiconductor substrate.

The insulating film 111 is formed from an oxide film (hereinafter, to be referred to as an HDP (High Density Plasma) film) formed by a HDP method in many cases. Since the HDP method has a high anisotropy in the growth of the insulating film, it is difficult to fill a trench portion shaded by the foreign substance with the insulating film, failing to conduct the burying step on such a trench portion.

Figure 4B:
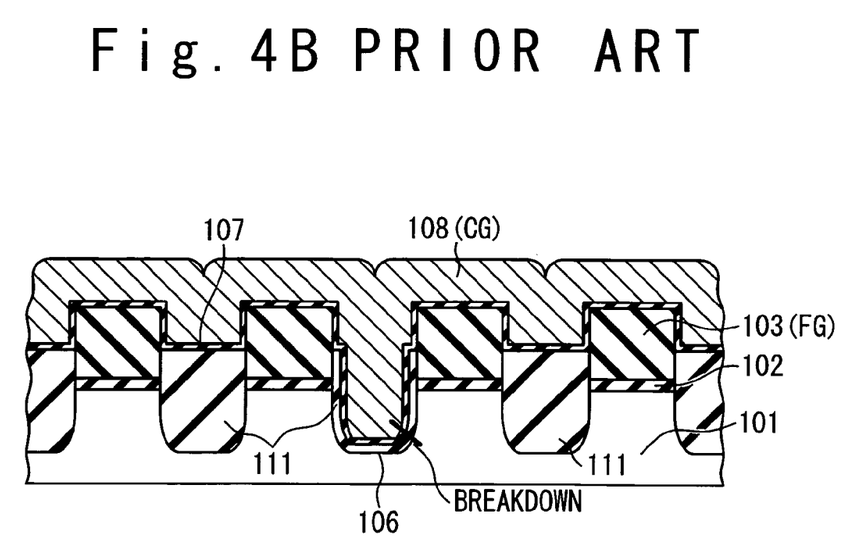

When such a non-buried state with the insulating film occurs in one portion of the trench, a capacitive insulating film 107 and a control gate film 108 are formed in the trench 106 in the subsequent steps, as shown in FIG. 4B. As a result, the control gate film 108 for the control gate CG faces the semiconductor substrate 101 only through the thin insulating film 111 and the capacitive insulating film 107. For this reason, when a predetermined voltage is applied to the control gate CG in the data write or read operation into or from the memory cell, the capacitive insulating film 107 is broken down because of electric field applied between the control gate CG and the semiconductor substrate 101, resulting in leakage between them. This does not cause any problem in a peripheral transistor that operates in a normal power supply voltage. However, this would cause an insufficient write operation, an insufficient read operation and an insufficient erase operation in the flash memory that uses a high voltage, and needs detection of a minute current difference. Thus, it is difficult to provide a flash memory with high reliability.

This problem would be caused in the above conventional example. For example, if the foreign substance is adhered in a manner to cover one portion of the trench upon the forming of the first insulating film, the first insulating film is not formed, and the second insulating film is also not formed thereon. As a result, the trench portion is not filled with any insulating films.

In recent years, elements have been developed to have a finer structure, and the trench-type device isolation film being miniaturized. For this reason, fine dusts and foreign substances causes serious problems, although having not caused any problems conventionally.

Also, when a trench-type device isolation insulating film STI is formed by using trenches with a small size, and insulating films, there is a problem that both sides of the trench opening are made in contact with each other during the forming step of the insulating film to be buried in the trench, to close the opening of the trench. In this case, the same state as shown in FIG. 4A is caused.

SUMMARY OF THE INVENTION

In an aspect of the present invention, a method of manufacturing a semiconductor device with a shallow trench isolation structure, is achieved by forming trenches extending into a semiconductor substrate; by forming a first insulating film to fill the trenches and to cover a whole surface of the semiconductor substrate; by carrying out a first chemical mechanical polishing (CMP) method to remove the first insulating film such that the first insulating film is left only in the trenches; by forming a second insulating film to fill the trenches and to cover a whole surface of the semiconductor substrate; by and carrying out a second CMP method to remove the second insulating film such that the second insulating film is left only in the trenches.

Here, laminate structures are formed on the semiconductor substrate between two of the trenches, and each of the laminate structures includes a stopper film. The carrying out a first CMP method may be achieved by carrying out the CMP method to remove the first insulating film on the laminate structures by using the stopper film.

Also, the forming a first insulating film may be achieved by forming the first insulating film by a high density plasma method.

Also, the forming a second insulating film may be achieved forming the second insulating film by a high density plasma method.

Also, the method may be achieved by further including etching to remove a foreign substance, after the first CMP method is carried out and before the second insulating film is formed. In this case, the etching may be achieved by carrying out wet etching. Also, the etching may be achieved by carrying out wet etching by using hydrofluoric acid.

Also, the method may be achieved by further including checking whether all the trenches are filled with the first insulating film, after the first CMP method is carried out. The forming a second insulating film and the carrying out a second CMP are carried out when it is determined that all the trenches are not filled with the first insulating film.

In this case, the method may be achieved by further including checking whether all the trenches are filled with the first or second insulating film, after the second CMP method is carried out. The forming a first insulating film and the carrying out a first CMP are carried out again when it is determined that all the trenches are not filled with the first or second insulating film.

In another aspect of the present invention, a method of manufacturing a semiconductor device with a shallow trench isolation structure, is achieved by forming trenches extending into a semiconductor substrate; by forming an insulating film to fill the trenches and to cover a whole surface of the semiconductor substrate; by carrying out a chemical mechanical polishing (CMP) method to remove the insulating film such that the insulating film is left only in the trenches; by checking whether all the trenches are filled with the insulating film, after the CMP method is carried out; by and repeating the forming an insulating film and the carrying out a CMP method, when it is determined that all the trenches are not filled with the insulating film.

DESCRIPTION OF THE PREFERRED EMBODIMENTS

Hereinafter, a method of manufacturing a semiconductor device of the present invention will be described in detail with reference to the attached drawings. The semiconductor device is such as a flash memory having the plan layout shown in FIG. 1 and the circuit configuration shown in FIG. 2.

First Embodiment

Figure 5:
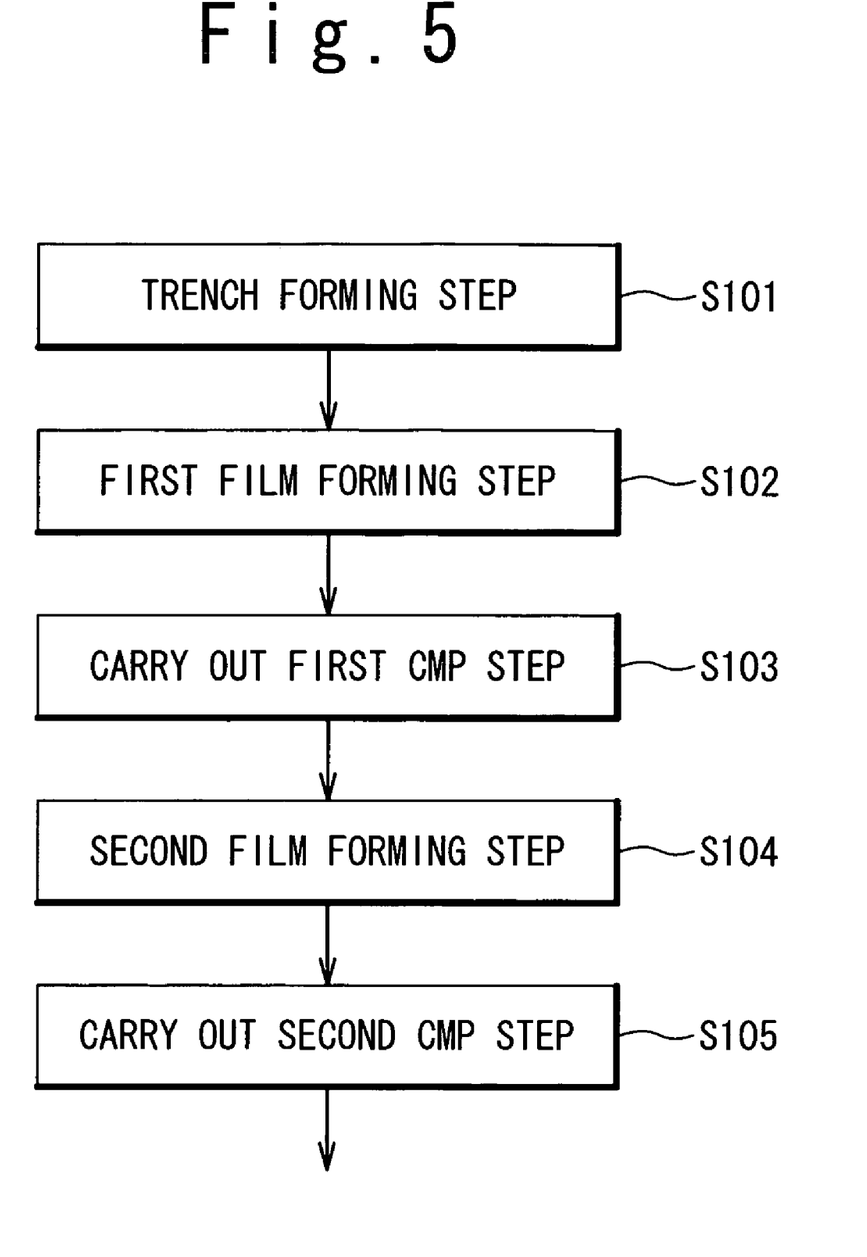
FIG. 5 is a flow chart showing a manufacturing process of a flash memory according to a first embodiment of the present invention.

FIG. 5 is a flow chart showing a method of manufacturing a semiconductor device with a trench-type device isolation insulating film STI according to the first embodiment of the present invention. As shown in FIG. 5, the manufacturing process includes a trench forming step S101 to form trenches in a semiconductor substrate, a first film forming step S102 to form a first insulating film to be buried in the trenches, a first CMP step S103 to polish the first insulating film by a CMP step, a second film forming step S104 to form a second insulating film to fill voids produced in the trenches, and a second CMP step S105 to polish the second insulating film by the CMP step.

Figure 6A:
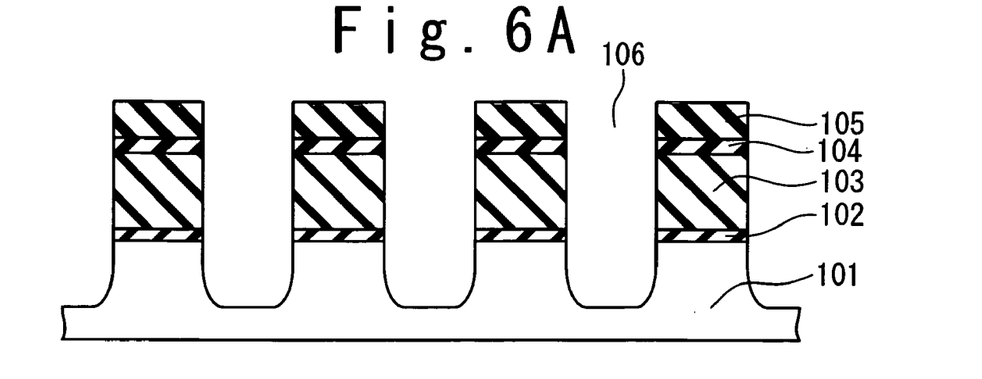
FIGS. 6A to 6F are cross sectional views showing the flash memory according to the first embodiment in the manufacturing process.

FIGS. 6A to 6F are cross sectional views of the semiconductor device taken along the line A-A of FIG. 1. First, as shown in FIG. 6A, a tunnel oxide film 102 such as a silicon thermal oxide film, a floating gate film 102 of a polysilicon film, a buffering silicon oxide film 103 and a silicon nitride film 104 as a stopper film are successively formed on the surface of a semiconductor substrate such as a silicon substrate 101 to have predetermined thicknesses, respectively. Subsequently, in the trench forming step S101, these films are etched to form a pattern with a plurality of island shapes which are arranged in a predetermined interval in the X-direction to extend in the Y-direction, as shown in FIG. 1. Subsequently, the silicon substrate 101 is etched to a predetermined depth by using these laminated films as a mask. Thus, device isolation trenches 106 are formed.

Figure 6B:
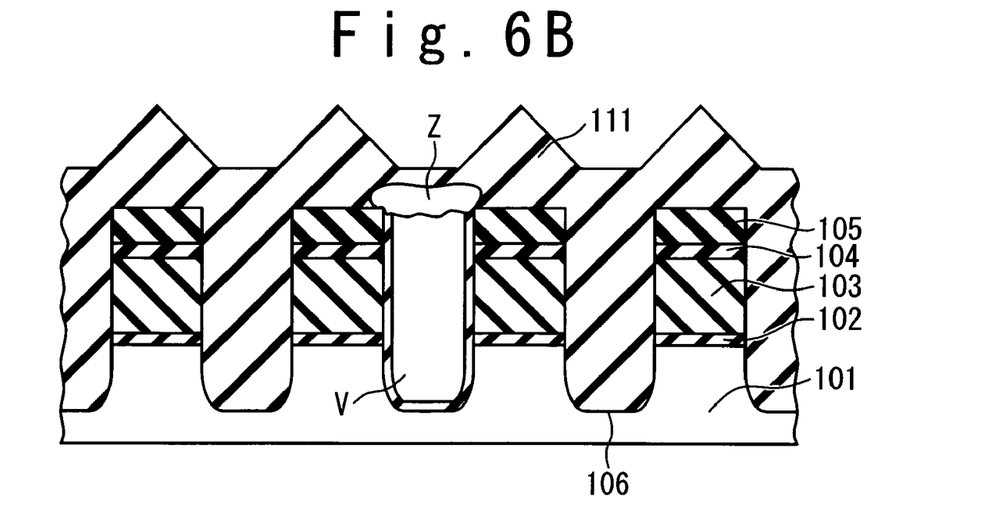

Next, as shown in FIG. 6B, in the first film forming step S102, a first silicon oxide film (hereinafter, referred to as a first HDP film) 111 is formed by an HDP method (high-density plasma method). The first HDP film 111 is formed to fill the trenches 106 and to cover the surface of the nitride film 105. At this time, there is a case that a part of the first HDP film on the inner wall of a film forming chamber (not shown) is separated from the inner wall and adheres to the surface of the silicon substrate, as described above. In this example, it is supposed that the foreign substance Z such as the adhered part of the first HDP film covers one portion of the trenches 106, as shown in FIG. 6B. In this case, the first HDP film 111 cannot be formed in a region right under the foreign substance Z inside the trench 106. Therefore, the trench 106 is not completely filled with the first HDP film 111, and the first HDP film 111 has been only formed thin before the foreign substance Z adheres to the opening of the trench 106. In some case, no first HDP film is formed right under the foreign substance Z.

Figure 6C:
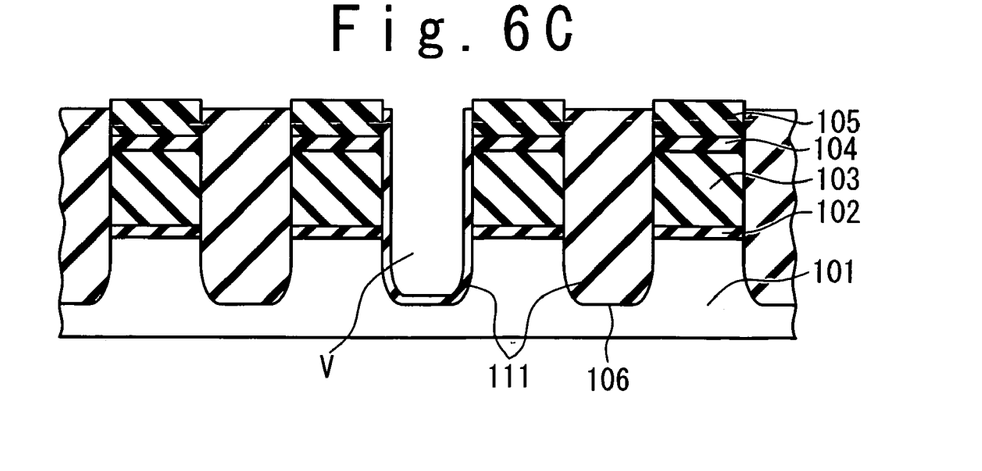

Next, as shown in FIG. 6C, the first HDP film 111 is polished by the first CMP method. In the first CMP step, the point of time at which the nitride film 105 as the stopper film has been polished by a predetermined thickness from the surface is defined as a polishing end point. Thus, the first HDP film 111 is polished at least to the surface of the nitride film 105 or to a level that is slightly lower than the surface. Moreover, the foreign substance Z adhered to the opening of the trench 106 is removed by the first CMP method so that a void V is formed in one portion of the trench 106 which is not completely filled with the first HDP film 111.

Figure 6D:
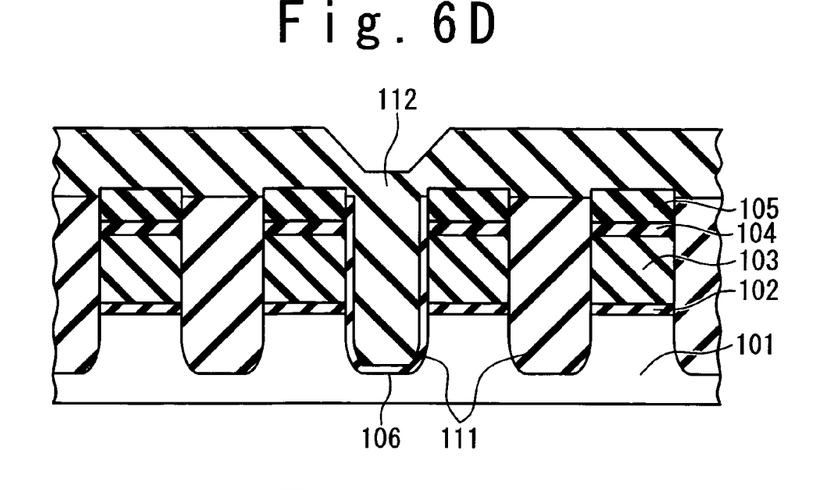

Next, as shown in FIG. 6D, a second film forming step is carried out in which a second silicon oxide film (hereinafter, referred to as second HDP film) 112 is formed by the HDP method. In the same manner as the first HDP film 111, the second HDP film 112 is formed to have a thickness that is slightly higher than the surface of the nitride film 105 at least. Thus, one portion of the trench 106 that has not been completely filled with the first HDP film 111 is completely filled with the second HDP film 112. In this case, one portion of the second HDP film grown on the inner wall of a film forming chamber (not shown) is separated from the inner wall to float in the film growing chamber and sometimes adhere to the trench in the surface of the silicon substrate in the same manner as the forming step of the first HDP film. However, there is no possibility that a foreign substance from the second HDP film adheres to the same position of the silicon substrate as the position on which a foreign substance from the first HDP film has been adhered. Therefore, even if a foreign substance from the second HDP film adheres to the surface of the silicon substrate, the foreign substance is not adhered to the portion at which the first HDP film has been completely buried, thereby eliminating the possibility of the foreign substance interfering the growth of the second HDP film.

Figure 6E:
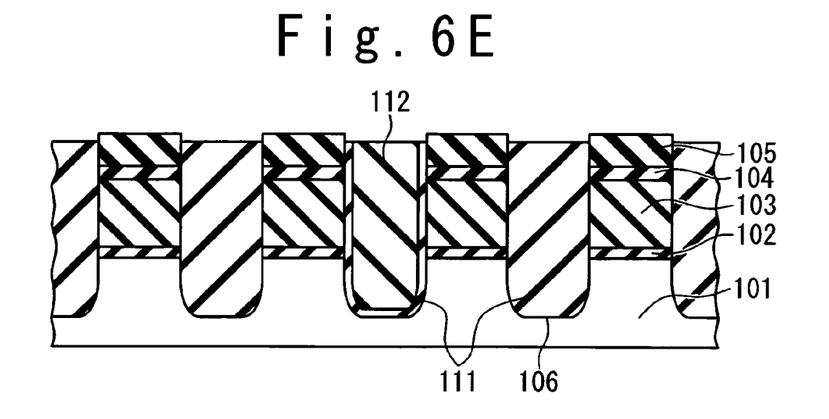

Next, as shown in FIG. 6E, the second HDP film 112 is polished by the second CMP method. In the second CMP step, the point of time at which the nitride film 105 serving as the stopper film has been further polished by a predetermined thickness from the surface subjected to the first CMP step is defined as a polishing end point. Thus, the second HDP film 112 is polished to the surface of the nitride film 105 or to a level that is slightly lower than the surface at least. Moreover, even when the foreign substance has been adhered upon forming the second HDP film 112, the foreign substance is simultaneously polished and removed by the second CMP method.

Through the above-mentioned process, the first HDP film 111 is buried in the trench 106 formed in the silicon substrate 101, or the first HDP film 111 and the second HDP film 112 are buried in one portion of the trench 106 in a laminated state. In some case, only the second HDP film 112 is buried in another portion of the trench (not shown). Moreover, the nitride film 105 is etched, and the buffering oxide film 104 of the lower layer is further etched and removed. In this case, the surfaces of the first and second HDP films 111 and 112 are also etched to a middle height of the floating gate film 103 in the height direction so that these HDP films remaining after the etching step function as STI films.

Figure 6F:
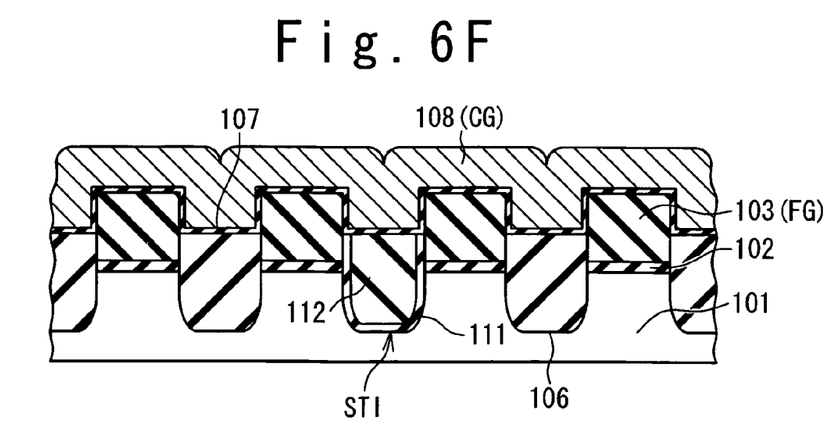

After the trench-type device isolation insulating film STI is formed as described above, an ONO film (laminated layer of oxide film/nitride film/oxide film) 107 is formed thinly in a range from 200 to 250 Angstroms over the entire surface as a capacitive insulating film, as shown in FIG. 6F, and a polysilicon film is formed thereon as a control gate film 108. Moreover, by etching the control gate film 108, the capacitive insulating film 107 and further the floating gate film 103 located right below, a stripe pattern is formed to extend in the X-direction as shown in FIG. 1. Thus, an island-shaped floating gate FG and the control gates CG as a word line WL extending in the X-direction are formed.

Next, although being not shown, an oxide film located in a trench isolation region on the source side is etched and removed by using a photolithography technique. Moreover, an impurity is implanted into the silicon substrate 101 in a self-alignment by utilizing the control gate CG. Thus, as shown in FIG. 1, a source region S and a drain region D are formed. As described above, the source region S is provided as a source line SL to extend in the X-direction between the trench-type device isolation insulting films STI. Thus, a memory cell M of a flash memory is completed. Thereafter, although being not shown, an interlayer insulating film is formed, and a bit line contact BC is formed to connect to the drain region D, as shown in FIGS. 1 and 2. Moreover, a bit line BL is formed thereon so that a flash memory is completed.

In this flash memory, even when a foreign substance adheres to one portion of the trenches 106 of the silicon substrate 101 upon forming the first HDP film 111 so that the trench portion is not completely or sufficiently filled with the first HDP film 111 during the manufacturing process of the trench-type device isolation insulating film STI, the foreign substance can be removed through the first CMP step. Moreover, upon the forming of the second HDP film 112, the portion that has not been filled with the first HDP film 111 is completely filled with the second HDP film 112. Thus, unlike the conventional technique shown in FIGS. 4A and 4B, it becomes possible to preliminarily prevent the device isolation insulating film STI from being manufactured to have one portion of the trench being not completely or sufficiently filled with the insulating film. Therefore, there is no case that the ONO film 107 and the control gate film 108 to be formed in the subsequent step are not formed in the trench 106 to a position deeper than the surface of the silicon substrate 101. Thus, an HDP film having a sufficient height can be interpolated between the control gate CG and the silicon substrate 101. Also, it becomes possible to positively prevent a leakage between the control gate CG and the silicon substrate 101 and also to prevent a writing operation failure, a reading operation failure and an erasing operation failure of data to and from memory cell caused by the leakage so that it is possible to achieve a flash memory with high reliability.

Second Embodiment

Figure 7:
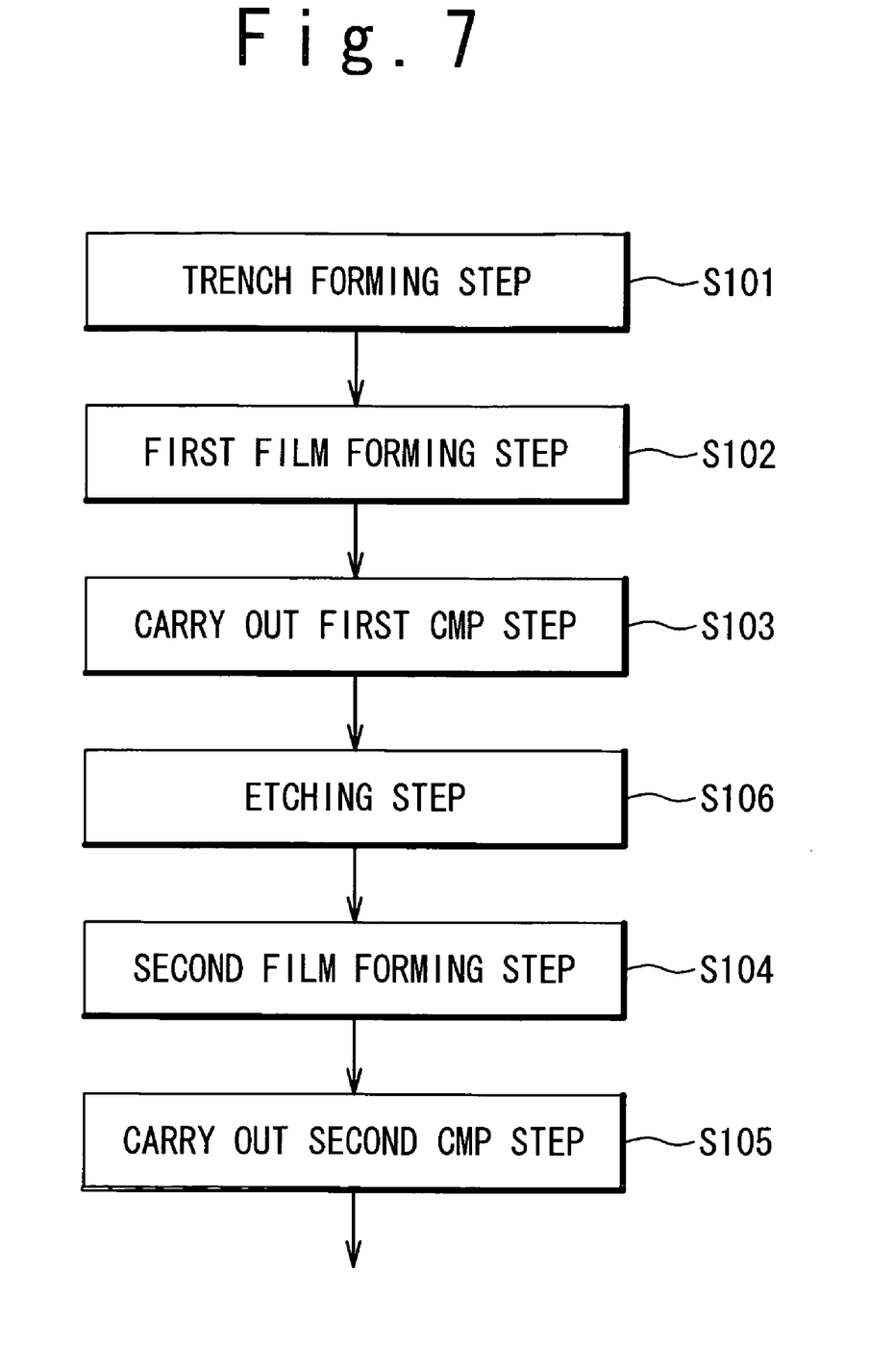
FIG. 7 is a flow chart showing the manufacturing process of the flash memory according to a second embodiment of the present invention.

FIG. 7 is a flow chart showing a manufacturing method of a trench-type device isolation insulating film STI according to the second embodiment of the present invention. In the same manner as the first embodiment, the second embodiment includes the trench forming step S101, the first film forming step S102, the first CMP step S103, the second film forming step S104 and the second CMP step S105. However, an etching step S106 is carried out immediately after the first CMP step S103.

Figure 8A:
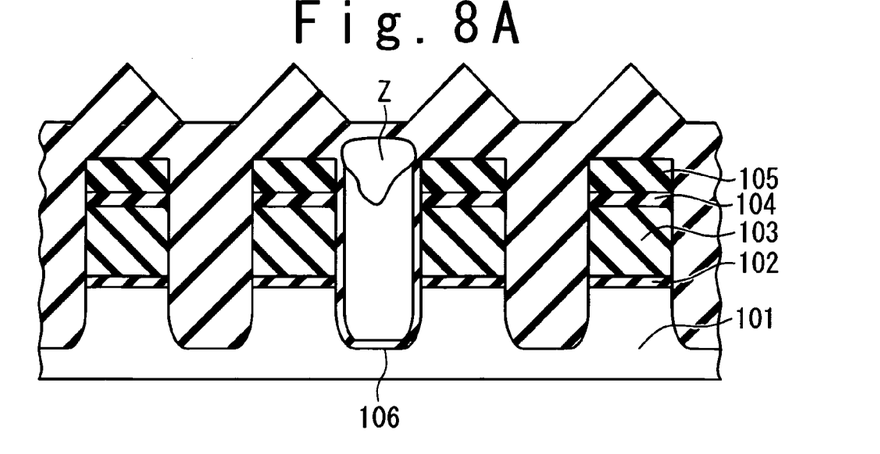
FIGS. 8A to 8C are cross sectional views showing the flash memory according to the second embodiment in the manufacturing process.
Figure 8B:
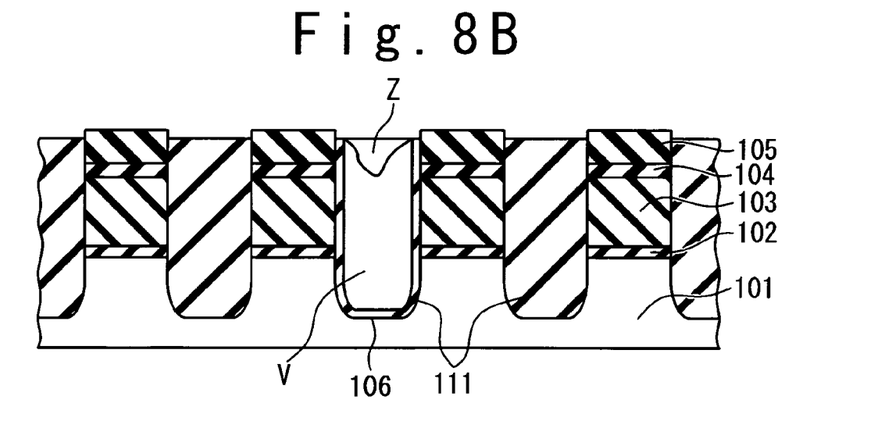
Figure 8C:
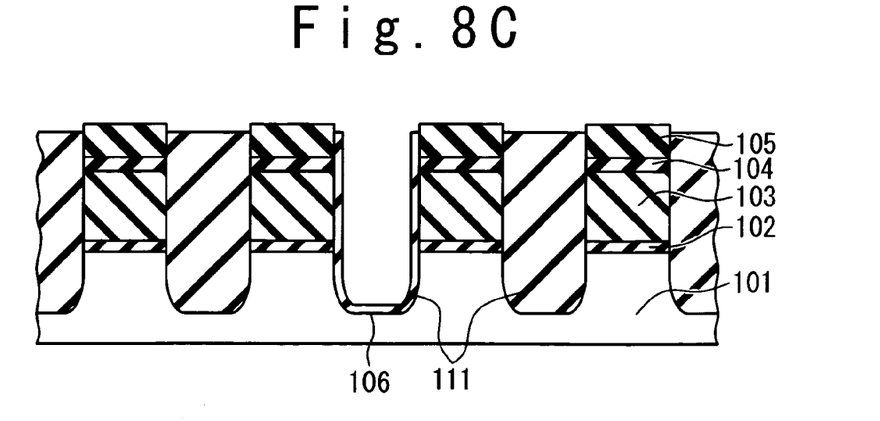

FIGS. 8A to 8C are cross sectional views showing flash memory along line A-A of FIG. 1 in the same manner as the first embodiment. Here, the same components as those of the first embodiment are allocated with the same reference numerals. As shown in FIG. 8A, a tunnel oxide film 102 such as a silicon thermal oxide film, a floating gate film 103 of a polysilicon film, a buffering silicon oxide film 104 and a silicon nitride stopper film 105 are successively formed on the surface of a silicon substrate 101 with predetermined thicknesses, respectively. Subsequently, these films are successively etched, and by using these laminated films as masks, the silicon substrate 101 is etched to a predetermined depth so that device isolation trenches 106 are formed.

Next, the first HDP film 111 is formed by the HDP method. The first film forming step is completely the same as that of the first embodiment. In this case, a foreign substance Z is sometimes adhered so as to cover one portion of the trench 106. As a result, one portion of the trench 106 is not completely or sufficiently with the first HDP film 111 in the same manner. However, in some case, the foreign substance Z is adhered to a deep position inside the trench 106, and this state is shown in the second embodiment.

As shown in FIG. 8B, the first HDP film 111 is polished by the first CMP method in the same manner as the first embodiment. The foreign substance adhered onto the opening of the trench 106 is polished and removed by the first CMP method. However, with respect to the foreign substance Z intruded into the trench 106, it is sometimes difficult to completely polish and remove this. As a result, one portion of the foreign substance Z remains inside the trench 106. FIG. 8B shows a state in which one portion of the foreign substance Z remains inside the trench 106. When the foreign substance Z remains in this manner, even if the second HDP film is formed and the second CMP step is carried out, the trench 106 might not be completely or sufficiently with the HDP film.

Therefore, in the second embodiment, after the first CMP step S103, an etching step is carried out by using hydrofluoric acid. The surface of the first HDP film 111 is thinly etched through this etching step S106, and simultaneously with this step, the foreign substance Z intruded into the trench 106, that is, the foreign substance Z made from the same material as the first HDP film 111 is simultaneously etched, so that the foreign substance Z is virtually completely removed from the inside of the trench 106. Moreover, even when one portion of the foreign substance Z is left, this portion is maintained in a state dropped to the bottom of the trench 106 so that it forms an integral portion with the first HDP film 111 formed in the trench 106. Thus, this structure forms a state in which a void V is opened at a portion of the trench 106, that is, a portion in which the first HDP film 111 is not completely buried.

Next, as shown in FIG. 8C, the second HDP film 112 is formed by using the HDP method in the second film forming step. Thus, the portion of the trench 106 that has not been completely or sufficiently filled with the first HDP film 111 is completely filled with the second HDP film 112. At this time, even if the foreign substance generated upon forming the second HDP film 112 adheres thereto. However, the possibility of the foreign substance adhering to the void V is almost zero. Therefore, the trench 106 is positively filled with the HDP film, in the same manner as explained in the first embodiment.

Next, although the cross sectional views are omitted, the second HDP film 112 is polished by the second CMP step in the same manner as the first embodiment. The foreign substance adhered upon forming the second HDP film 112 is also simultaneously polished and removed by the second CMP step. Thus, the first HDP film 111 is buried in the trench formed in the silicon substrate 101, or the first HDP film 111 and the second HDP film 112 are buried in a laminated state in one portion of the trench 106. In some case, only the second HDP film 112 is buried in another portion of the trench. Moreover, the nitride film 105 is etched, and the buffering oxide film 104 as the lower layer is further etched and removed, so that the remaining HDP films are formed a trench-type device isolation insulating film STI film.

In the above-mentioned second embodiment, the foreign substance is completely removed by carrying out an etching step after the first CMP step. However, the polishing amount in the first CMP step may be set greater than a normal polishing amount in the CMP step. In other words, the nitride film as a stopper film in the CMP step is formed slightly thicker than the normal thickness so that the polishing amount of the nitride film in the first CMP step is made greater. Thus, the polishing amount of the surface of the first HDP film is increased so that it becomes possible to enhance the effect for removing the foreign substance adhering in a manner so as to plug the trench.

In the above-mentioned first and second embodiments, in place of the second HDP film, a silicon oxide film (hereinafter, referred to as a CVD film) formed by the CVD method may be used. The CVD film exerts a lower anisotropic property upon film forming, compared with the HDP film, and is superior in flowing property after the film forming step. Therefore, even if a narrow void is left inside the trench due to an insufficient burying of the film caused by a foreign substance when the first HDP film is buried in the trench, it becomes possible to fill the void with the CVD film that has a lower anisotropic property and a superior flowing property.

Third Embodiment

Figure 9:
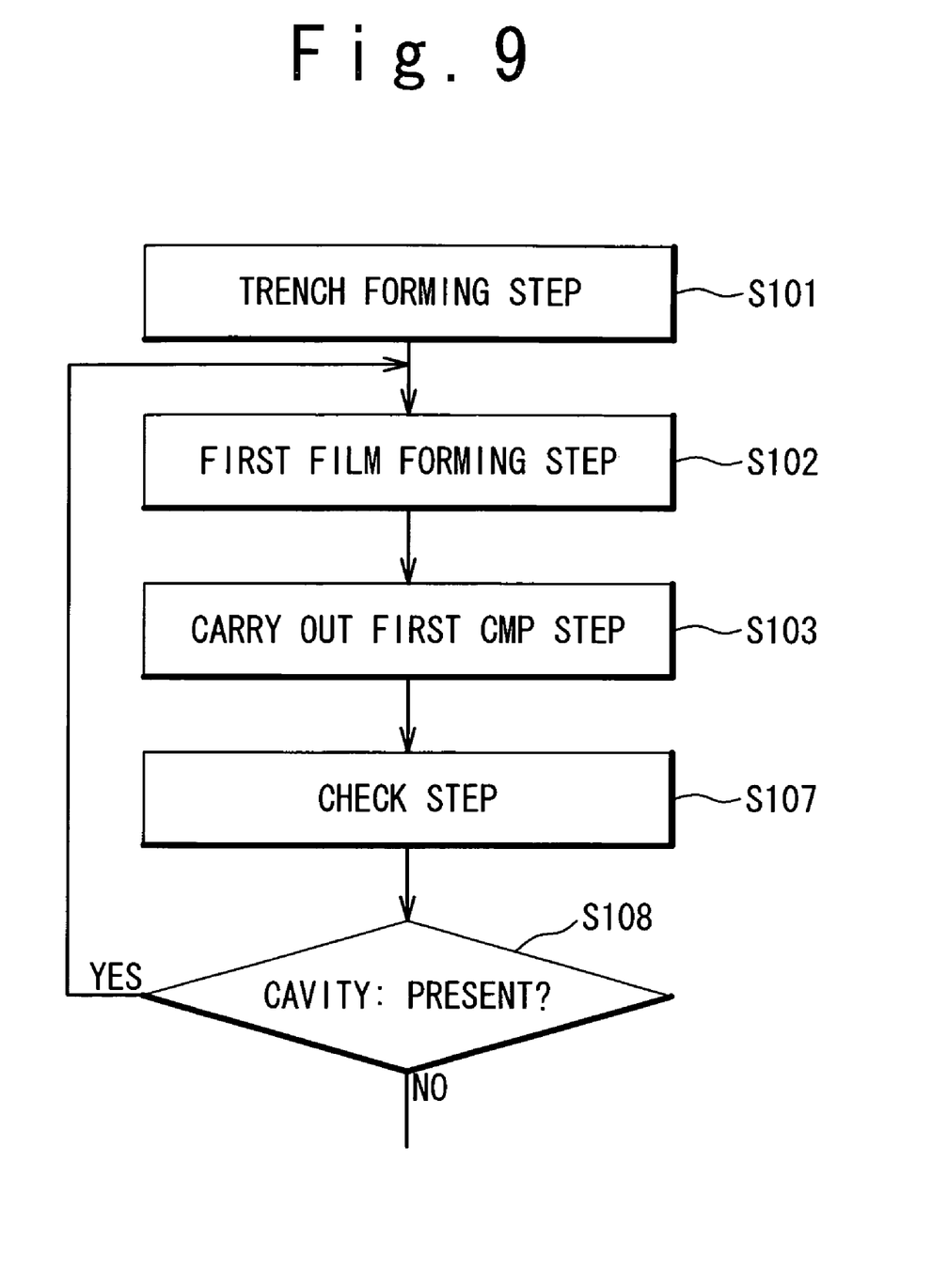
FIG. 9 is a flow chart showing the manufacturing process of the flash memory according to a third embodiment of the present invention.

FIG. 9 is a flow chart showing a manufacturing method according to the third embodiment of the present invention. In the third embodiment, basically, each of the film forming step S102 and the CMP step S103 is carried out once after the trench forming step S101. After the CMP step S103, an inspecting step S107 is carried out, and when the result of the inspecting step shows any void existing inside the trench (S108), the film forming step S103 and the CMP step S104 are repeated.

Since the third embodiment includes the same steps as those of first embodiment, the cross sectional views are omitted. However, referring to FIGS. 4-A and 4-B, the manufacturing process is clearly explained. First, as shown in FIGS. 6A to 6C, trenches 106 for a trench-type device isolation insulating films STI are formed in a silicon substrate 101, and the trenches 106 are filled with a first HDP film 111. Subsequently, the first CMP step is carried out so that the surface of the first HDP film 111 in the trenches 106 is polished. These trench forming step, first film forming step for forming the first HDP film and the first CMP step are completely the same as those of the first embodiment. Therefore, the detailed description thereof is omitted.

Thereafter, the trench-type device isolation insulating film ST1 thus manufactured is subjected to the inspecting step so as to examine whether or not the trenches 106 are completely filled with the first HDP film 111 (S107). When a void is partially present due to an incompletely filling step, the film forming step S102 for forming the first HDP film 111 and the subsequent CMP step S103 for polishing the first HDP film 111 are repeated. Thus, even when a foreign substance is generated upon carrying out the first film forming step and the CMP step to cause a void in the trench, the void can be filled with the HDP film by the second film forming step and the CMP step. Here, the trench filling step is completely conducted by carrying out the second film forming step and the CMP step. However, when a void is still present in the trench even after the second film forming step and the CMP step, the third or more film forming step and the CMP step may be carried out.

In third embodiment, when a good quality trench-type device isolation insulating film STI without any voids in the trench can be manufactured in the first film forming step and the CMP step, the second film forming step and the CMP step become unnecessary. Thus, it is possible to simplify the manufacturing process. Moreover, even if the trenches are not completely filled even after the second film forming step and the CMP step, the trenches are completely filled by repeating the third times or more. Thus, it becomes possible to manufacture an STI film having high reliability.

In the above-mentioned embodiments, a structural example has been shown in which the first HDP film and the second HDP film, or the first HDP film and the CVD film are laminated at one portion of a trench-type device isolation insulating film STI. However, with respect to trench portions that are not filled with any first HDP film, these portions are filled with only the second HDP film or the CVD film.

Also, the above-mentioned embodiments have described examples in which the present invention is applied to an STI film as a trench-type device isolation insulating film used for a flash memory. However, the present invention can be applied to any semiconductor device as long as it is provided with a trench-type device isolation insulating film.

What is claimed is:

1. A method of manufacturing a semiconductor device with a shallow trench isolation structure, comprising:
    forming trenches extending into a semiconductor substrate;
    forming a first insulating film to fully fill the trenches and to cover a whole surface of the semiconductor substrate;
    carrying out a first chemical mechanical polishing (CMP) to remove the first insulating film and any foreign substance that prevents any of the trenches from being fully filled by the first insulating film such that the first insulating film is left only in the trenches;
    forming a second insulating film to fill a concave in said first insulating film caused by said foreign substance; and
    carrying out a second CMP such that the second insulating film is left only in said concave.

2. The method according to claim 1, wherein laminate structures are formed on the semiconductor substrate between two of the trenches, and each of the laminate structures includes a stopper film,
    the carrying out a first chemical mechanical polishing (CMP) comprises:
        carrying out the CMP to remove the first insulating film on the laminate structures by using the stopper film.

3. The method according to claim 2, wherein carrying out the chemical mechanical polishing (CMP) comprises polishing to below a surface of the stopper film.

4. The method according to claim 1, wherein the forming a first insulating film comprises:
    forming the first insulating film by a high density plasma method.

5. The method according to claim 1, wherein the forming a second insulating film comprises:
    forming the second insulating film by a high density plasma method.

6. The method according to claim 1, further comprising:
    etching to remove a foreign substance, after the first chemical mechanical polishing (CMP) is carried out and before the second insulating film is formed.

7. The method according to claim 6, wherein the etching comprises:
    carrying out wet etching.

8. The method according to claim 7, wherein the etching comprises:
    carrying out wet etching by using hydrofluoric acid.

9. The method according to claim 1, further comprising:
    checking whether all the trenches are filled with the first insulating film, after the first chemical mechanical polishing (CMP) is carried out,
    wherein the forming a second insulating film and the carrying out a second CMP are carried out when it is determined that all the trenches are not filled with the first insulating film.

10. The method according to claim 9, further comprising:
    checking whether all the trenches are filled with the first or second insulating film, after the second chemical mechanical polishing (CMP) is carried out,
    wherein the forming a first insulating film and the carrying out a first CMP are carried out again when it is determined that all the trenches are not filled with the first or second insulating film.

11. A method of manufacturing a semiconductor device with a shallow trench isolation structure, comprising:
    forming trenches extending into a semiconductor substrate;
    forming an insulating film to fill the trenches and to cover a whole surface of the semiconductor substrate;
    carrying out a chemical mechanical polishing (CMP) to remove the insulating film such that the insulating film is left only in the trenches;
    checking whether all the trenches are filled with the insulating film, after the CMP is carried out; and
    repeating the forming an insulating film and the carrying out a CMP, if any of the trenches is prevented by a foreign substance from being filled with the insulating film.

12. The method according to claim 11,
    wherein laminate structures are formed on the semiconductor substrate between two of the trenches, and each of the laminate structures includes a stopper film, and
    wherein the carrying out a first chemical mechanical polishing (CMP) comprises:
    carrying out the CMP to remove the first insulating film on the laminate structures by using the stopper film.

13. A method of manufacturing a semiconductor device with a shallow trench isolation structure, comprising:
    forming trenches in a semiconductor substrate;
    forming a first insulating film to fill the trenches and to cover a whole surface of the semiconductor substrate;
    carrying out a first chemical mechanical polishing (CMP) to remove the first insulating film and any foreign substance that prevents any of the trenches from being filled such that the first insulating film is left only in the trenches;
    checking whether the trenches are filled with the insulating film, after the CMP is carried out;
    filling any of the trenches that are prevented from being filled with the first insulating film with a second insulating film; and carrying out a second CMP to remove the second insulating film such that the second insulating film is left only in any of the trenches that are prevented from being filled with the first insulating film.

14. The method according to claim 13, wherein, if all of the trenches are not filled with the insulating film, forming a second insulating film to fill the trenches and to cover a whole surface of the semiconductor substrate.

15. The method according to claim 14, further comprising:
carrying out a second chemical mechanical polishing (CMP) to remove the second insulating film such that the second insulating film is left only in the trenches.

16. The method according to claim 14, wherein the forming the second insulating film comprises forming the second insulating film to cover substantially an entirety of the surface of the semiconductor substrate.

17. The method according to claim 14, further comprising:
etching to remove a foreign substance, after the first chemical mechanical polishing (CMP) is carried out and before the second insulating film is formed.

18. The method according to claim 17, wherein the etching comprises carrying out wet etching.

19. The method according to claim 13,
wherein laminate structures are formed on the semiconductor substrate between two of the trenches, and each of the laminate structures includes a stopper film, and
wherein the carrying out the first chemical mechanical polishing (CMP) comprises:
carrying out the first CMP to remove the first insulating film on the laminate structures by using the stopper film.

20. The method according to claim 19, wherein carrying out the first chemical mechanical polishing (CMP) comprises polishing to below a surface of a stopper film.

21. The method according to claim 13, wherein the forming the first insulating film comprises forming the first insulating film to cover substantially an entirety of the surface of the semiconductor substrate.

* * * * *

UNITED STATES PATENT AND TRADEMARK OFFICE
CERTIFICATE OF CORRECTION

PATENT NO. : 7,449,393 B2  Page 1 of 1
APPLICATION NO. : 11/090839
DATED : November 11, 2008
INVENTOR(S) : Kenji Saitou et al.

It is certified that error appears in the above-identified patent and that said Letters Patent is hereby corrected as shown below:

In the drawings:
In Figures 4A and 4B, remove the label "PRIOR ART".

Signed and Sealed this

Thirty-first Day of August, 2010

David J. Kappos
*Director of the United States Patent and Trademark Office*